US012665483B2

(12) United States Patent
Kasparek et al.

(10) Patent No.: US 12,665,483 B2
(45) Date of Patent: Jun. 23, 2026

(54) HEAT-SINK-COUPLED CONDUCTOR STRUCTURES WITH INTEGRATED CURRENT SENSORS AND EDDY CURRENT MITIGATION

(71) Applicant: Allegro MicroSystems, LLC, Manchester, NH (US)

(72) Inventors: Christian Kasparek, Heidelberg (DE); Simon E. Rock, Heidelberg (DE)

(73) Assignee: Allegro MicroSystems, LLC, Manchester, NH (US)

( * ) Notice: Subject to any disclaimer, the term of this patent is extended or adjusted under 35 U.S.C. 154(b) by 148 days.

(21) Appl. No.: 18/605,998

(22) Filed: Mar. 15, 2024

(65) Prior Publication Data
US 2025/0293577 A1      Sep. 18, 2025

(51) Int. Cl.
*G01R 19/10* (2006.01)
*G01R 15/20* (2006.01)
*H02M 1/00* (2007.01)

(52) U.S. Cl.
CPC ........ *H02M 1/0009* (2021.05); *G01R 15/207* (2013.01); *G01R 19/10* (2013.01)

(58) Field of Classification Search
CPC .... H02M 1/0009; H02M 7/003; G01R 19/10; G01R 15/207; G01R 15/202; G01R 15/205
USPC ................................................... 324/754.29
See application file for complete search history.

(56) References Cited

U.S. PATENT DOCUMENTS

| 6,954,368 | B1 * | 10/2005 | Francoeur ............. | H02M 7/003 |
| | | | | 361/763 |
| 6,995,315 | B2 | 2/2006 | Sharma et al. | |
| 7,075,287 | B1 | 7/2006 | Mangtani et al. | |
| 7,166,807 | B2 | 1/2007 | Gagnon et al. | |
| 7,476,816 | B2 | 1/2009 | Doogue et al. | |
| 7,598,601 | B2 * | 10/2009 | Taylor .................. | G01R 15/207 |
| | | | | 257/E27.005 |
| 7,709,754 | B2 | 5/2010 | Doogue et al. | |

(Continued)

OTHER PUBLICATIONS

U.S. Appl. No. 18/447,665, filed Aug. 10, 2023, Kasparek.
U.S. Appl. No. 18/434,967, filed Feb. 7, 2024, Messier et al.

*Primary Examiner* — Christopher P Mcandrew
(74) *Attorney, Agent, or Firm* — DALY, CROWLEY, MOFFORD & DURKEE, LLP

(57) ABSTRACT

Systems, circuits, and methods provide heat-sink-coupled conductive structures having eddy current mitigation structures, formed as S-notches, and integrated current sensors. An example conductive structure includes a high-current conductor structure having a main current path including an S-notch portion configured to mitigate eddy currents. The structure includes a low-current conductor structure connected to a first heat sink and having a main current path configured to conduct a second current. A differential current sensor is connected to the low-current conductor structure and configured to detect current flowing in the high-current conductor structure. A power module includes the conductive structure and a power converter that is configured to convert power between the first current in the high-current conductor structure and the second current in the low-current conductor structure. The conductive structures and power modules can be used for EV applications.

32 Claims, 11 Drawing Sheets

(56) References Cited

U.S. PATENT DOCUMENTS

| | | | |
|---|---|---|---|
| 8,093,670 B2 | 1/2012 | Taylor | |
| 8,542,010 B2 * | 9/2013 | Cesaretti | G01R 33/0035 |
| | | | 324/202 |
| 8,896,295 B2 * | 11/2014 | Friedrich | G01R 33/0094 |
| | | | 324/207.2 |
| 9,664,497 B2 | 5/2017 | Kerdraon et al. | |
| 9,797,746 B2 | 10/2017 | Vuillermet et al. | |
| 9,797,963 B2 | 10/2017 | Friedrich et al. | |
| 9,810,519 B2 | 11/2017 | Taylor et al. | |
| 9,823,090 B2 | 11/2017 | Foletto et al. | |
| 9,869,566 B2 | 1/2018 | Tima et al. | |
| 9,976,876 B2 | 5/2018 | Metivier et al. | |
| 10,254,103 B2 | 4/2019 | Taylor et al. | |
| 10,310,028 B2 | 6/2019 | Latham et al. | |
| 10,323,958 B2 | 6/2019 | Kranz et al. | |
| 10,352,969 B2 | 7/2019 | Milano et al. | |
| 10,385,964 B2 | 8/2019 | Vuillermet et al. | |
| 10,481,181 B2 | 11/2019 | Bussing et al. | |
| 10,598,515 B2 | 3/2020 | Tima et al. | |
| 10,761,120 B2 | 9/2020 | Feucht et al. | |
| 10,782,152 B2 | 9/2020 | Vuillermet et al. | |
| 10,809,094 B2 | 10/2020 | Foletto et al. | |
| 10,884,031 B2 | 1/2021 | Vuillermet et al. | |
| 10,908,190 B2 | 2/2021 | Bussing et al. | |
| 10,962,385 B2 | 3/2021 | Metivier et al. | |
| 10,996,289 B2 | 5/2021 | Latham et al. | |
| 11,047,928 B2 | 6/2021 | Vuillermet et al. | |
| 11,099,217 B2 | 8/2021 | Vuillermet et al. | |
| 11,150,273 B2 | 10/2021 | Liu et al. | |
| 11,183,436 B2 | 11/2021 | Liu et al. | |
| 11,226,382 B2 | 1/2022 | Augendre et al. | |
| 11,262,385 B2 | 3/2022 | Milano et al. | |
| 11,320,466 B1 | 5/2022 | Briano et al. | |
| 11,326,903 B1 | 5/2022 | Casu et al. | |
| 11,385,075 B2 | 7/2022 | Foletto et al. | |
| 11,513,141 B2 | 11/2022 | Vuillermet et al. | |
| 11,519,939 B2 | 12/2022 | Liu et al. | |
| 11,656,250 B2 | 5/2023 | Vuillermet et al. | |
| 11,770,632 B2 | 9/2023 | Judkins, III et al. | |
| 11,885,866 B2 | 1/2024 | Vuillermet et al. | |
| 11,892,476 B2 | 2/2024 | Rock et al. | |
| 11,940,470 B2 | 3/2024 | Messier et al. | |
| 12,306,217 B2 | 5/2025 | Houis | |
| 2004/0024937 A1 * | 2/2004 | Duncan | H02M 7/003 |
| | | | 710/100 |
| 2006/0219436 A1 | 10/2006 | Taylor et al. | |
| 2007/0279053 A1 * | 12/2007 | Taylor | G01R 33/07 |
| | | | 324/252 |
| 2009/0121704 A1 * | 5/2009 | Shibahara | G01R 15/202 |
| | | | 324/117 R |
| 2014/0191772 A1 * | 7/2014 | Hetzler | G01R 19/10 |
| | | | 324/705 |
| 2018/0031613 A1 * | 2/2018 | Nakayama | G01R 19/25 |
| 2018/0180649 A1 * | 6/2018 | Paci | G01R 15/205 |
| 2021/0080489 A1 * | 3/2021 | Koizumi | G01R 15/207 |
| 2021/0313256 A1 * | 10/2021 | McPherson | H10W 70/481 |
| 2022/0137097 A1 | 5/2022 | Milano et al. | |
| 2022/0397382 A1 | 12/2022 | Vuillermet et al. | |
| 2023/0251290 A1 * | 8/2023 | Vuillermet | G01R 19/0092 |
| | | | 324/126 |
| 2023/0258693 A1 * | 8/2023 | Rock | G01R 15/207 |
| | | | 324/126 |
| 2023/0298779 A1 | 9/2023 | Messier et al. | |
| 2023/0332965 A1 | 10/2023 | Casu et al. | |
| 2023/0333147 A1 | 10/2023 | Messier et al. | |
| 2023/0417802 A1 | 12/2023 | Vuillermet et al. | |
| 2024/0027560 A1 | 1/2024 | Vuillermet et al. | |

* cited by examiner

100

101

102 (behind 101)

103 + heat sink (in back)

104

104a

104b

Current (dimensions shown are examples)

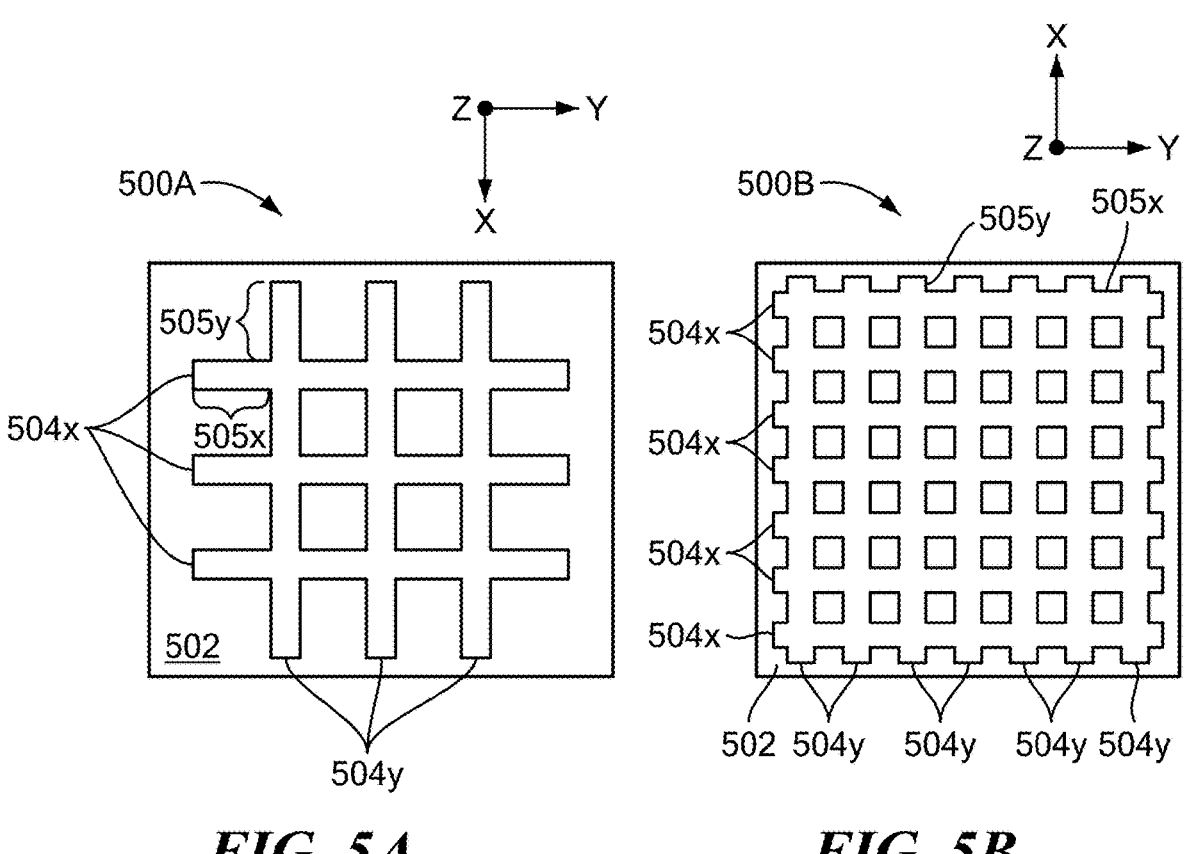
FIG. 5A
FIG. 5B
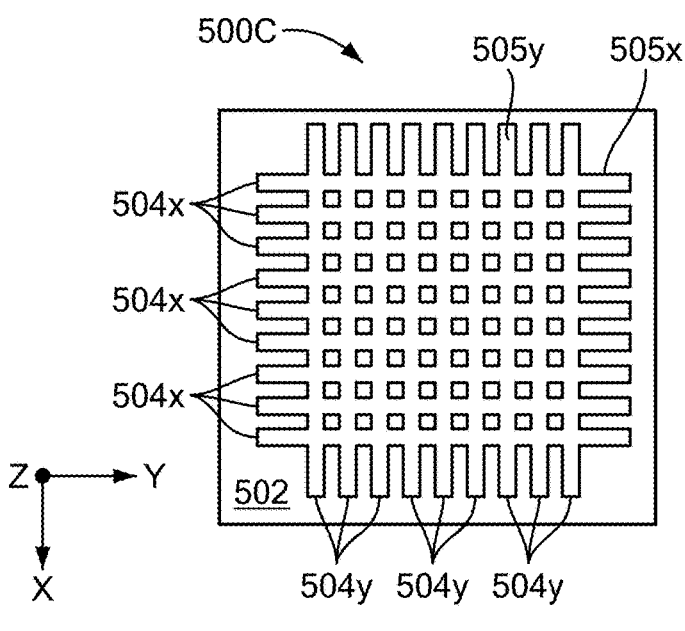
FIG. 5C

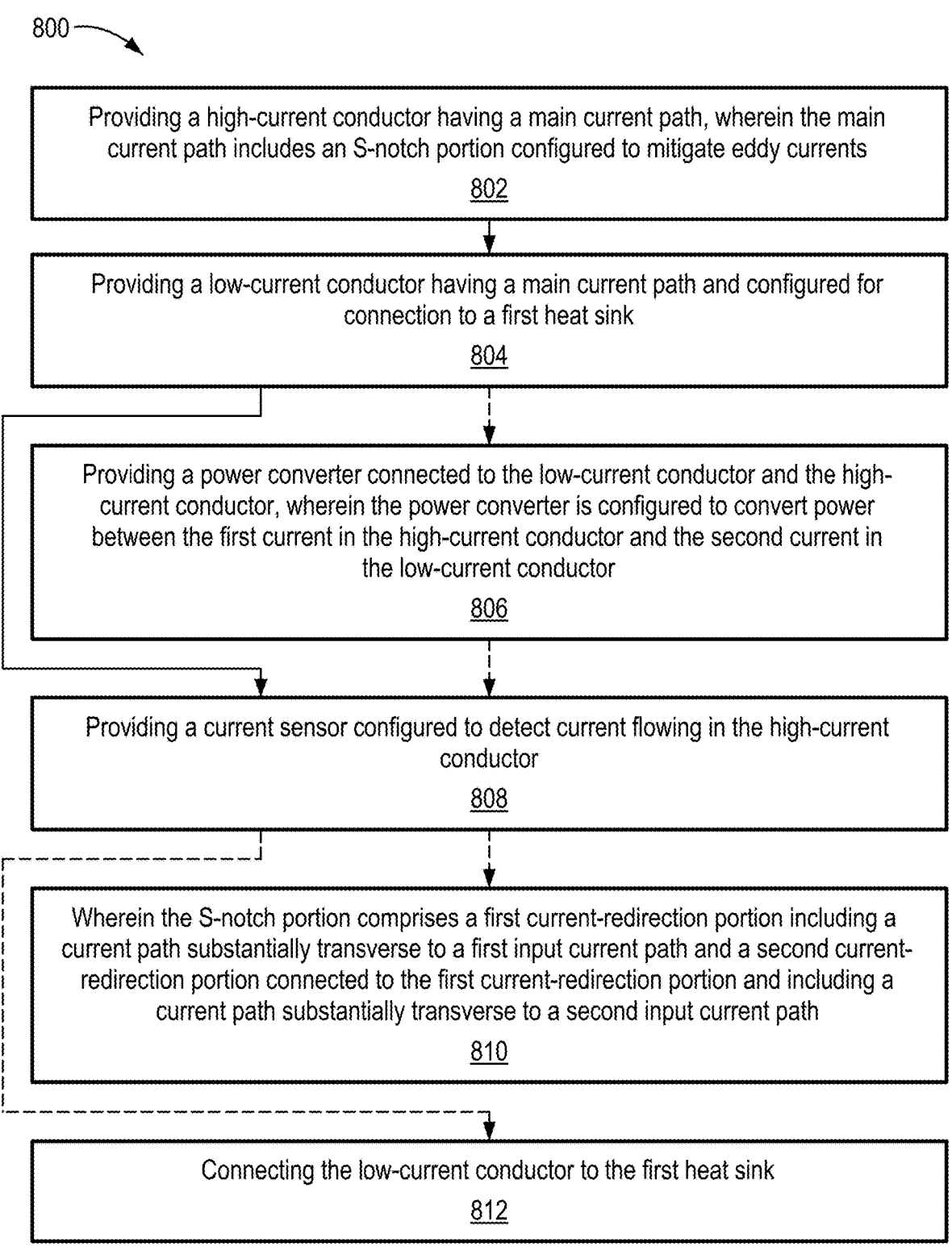

800

Providing a high-current conductor having a main current path, wherein the main current path includes an S-notch portion configured to mitigate eddy currents
802

Providing a low-current conductor having a main current path and configured for connection to a first heat sink
804

Providing a power converter connected to the low-current conductor and the high-current conductor, wherein the power converter is configured to convert power between the first current in the high-current conductor and the second current in the low-current conductor
806

Providing a current sensor configured to detect current flowing in the high-current conductor
808

Wherein the S-notch portion comprises a first current-redirection portion including a current path substantially transverse to a first input current path and a second current-redirection portion connected to the first current-redirection portion and including a current path substantially transverse to a second input current path
810

Connecting the low-current conductor to the first heat sink
812

*FIG. 8*

HEAT-SINK-COUPLED CONDUCTOR STRUCTURES WITH INTEGRATED CURRENT SENSORS AND EDDY CURRENT MITIGATION

BACKGROUND

Electric vehicles (EVs) typically include one or more alternating current (AC) motors and a traction inverter or power module, which is a power electronic device/system that converts a direct current (DC) supply of power from the vehicle's batteries to an AC output and controls the current for use by the vehicle's one or more electric motors. The AC output is then used to power the electric motor(s) providing drive for the vehicle. Traction inverters are sometime referred to as variable frequency drives, motor drives, traction drives, and variable speed drives. Traction inverters typically include semiconductor switches such as power transistors, for example, insulated-gate bipolar transistors (IGBTs), silicon carbide (SiC) metal oxide field effect transistors (MOSFETs), or gallium nitride (GaN) MOSFETs, which are controlled by controllers, typically referred to as gate drivers. In electric and hybrid vehicles, the electric motor can also act as a generator during regenerative braking, converting the vehicle's kinetic energy into AC power. This is then converted to DC power by the traction inverter, allowing the battery to be charged. The gate drivers and associated power transistors of traction inverter (power module) when considered together are commonly referred to as power converters. A power converter can be an inverter type (e.g., changing AC to DC and vice versa) or a converter type (e.g., changing DC at one voltage and/or current to DC at another voltage and/or current). Power converters commonly include six power transistors for rectification for three-phase EV motors.

In order to accurately measure current flowing in the power module, a current sensor having magnetic field sensing elements is typically used. The current sensors typically measure current flowing in a high-side conductor such as a bus bar. Such conductors, however, typically develop eddy currents which degrade accurate current measurements. These eddy currents typically increase in magnitude—and negative impact on current measurement—with increasing frequency of current in the conductor.

FIG. 1 diagram of is a diagram of a prior art planar conductor structure with current sensor 100 used for EV power module applications. Structure 100 is shown with a first planar conductor 101 in front of a ceramic layer 102, which in turn is positioned in front of another planar conductor 103. A current (arrow) is indicated as flowing in the first planar conductor 101. A magnetic field sensor 104 having first and second magnetic field sensing elements 104a-b is configured to detect current in first planar conductor 101. Planar conductor 101 may be configured to carry a relatively high current while planar conductor 103 may be configured to carry a lower current. In some applications, structure 100 may be connected to a heat sink (not shown) such as a block of copper or a rectangular aluminum conduit carrying water as a coolant.

Such structures typically produce eddy currents in the conductors, particularly when a heat sink is used with or connected to the conductor structure. These eddy currents can degrade accuracy of current measurements, with the degradation being more significant with increasing frequency (of AC or modulated DC). Because of this, traction inverters designed to operate at higher frequencies may have unreliable or inaccurate current measurements using such prior art conductor and current sensor structures.

SUMMARY

Aspects of the present disclosure are directed to heat-sink-coupled conductor structures with integrated current sensors and eddy current mitigation as well as related methods.

One general aspect of the present disclosure includes a power module with integrated current sensor. The power module can include: a high-current conductor structure having a main current path configured to conduct a first current, where the main current path includes an S-notch portion configured to mitigate eddy currents; a low-current conductor structure connected to a first heat sink and having a main current path configured to conduct a second current; a power converter connected to the high-current conductor structure and the low-current conductor structure, where the power converter is configured to convert power between the first current in the high-current conductor structure and the second current in the low-current conductor structure; and a differential current sensor connected to the low-current conductor structure, where the differential current sensor is configured to detect current flowing in the high-current conductor structure.

Implementations may include one or more of the following features. The S-notch portion of the power module (power module structure) may include a first current-redirection portion including a current path substantially transverse to a first input current path and a second current-redirection portion connected to the first current-redirection portion and including a current path substantially transverse to a second input current path. The differential current sensor can have a longitudinal axis and first and second magnetic field sensing elements aligned on the longitudinal axis. The longitudinal axis of the differential current sensor may be aligned with a longitudinal axis of the main current path of the high-current conductor structure. The longitudinal axis of the differential current sensor may be aligned with the longitudinal axis of the high-current conductor structure, within a rotation angle ranging from about 1 degree to about 15 degrees about an axis normal to the longitudinal axis of the high-current conductor structure. The rotation angle may be between about 8 degrees and about 10 degrees. The high-current conductor structure may include first and second planar conductive layers and an insulator layer disposed between the first and second planar conductive layers, where the first planar conductive layer includes the main current path. The high-current conductor structure may include a direct bonded copper substrate. The power module may include one or more eddy current blockers disposed within the second planar conductive layer of the high-current conductor structure. The power module may include one or more eddy current blockers disposed within the low-current conductor structure. The S-notch portion can be disposed in the first planar conductive layer of the high-current conductor structure and the one or more eddy current blockers may include a first eddy current blocker disposed in the second planar conductive layer of the high-current conductor structure. The one or more eddy current blockers each may include an array of spaced-apart conductive structures. The one or more eddy current blockers may be disposed in the first planar conductive layer and/or the second planar conductive layer of the low-current conductor structure. The low-current conductor structure may include first and second planar conductive layers and an insulator layer disposed between the first and second planar conductive layers. The low-current conductor structure may include a direct bonded copper substrate. The power converter may include one or more transistors configured to convert power between ac power and dc power. The one or more transistors may include a plurality of transistors configured as a bridge or half-bridge. The plurality of transistors may be configured as an inverter. The power converter may include one or more diodes configured to convert power between AC power and DC power. The one or more diodes may include a plurality of diodes configured as a rectifier. The power module may include one or more busbars connected to the high-current conductor structure and configured to provide input current. The power module may include one or more busbars connected to the high-current conductor structure and configured to provide output current. The differential current sensor may include a plurality of Hall effect elements or plates. The differential current sensor may include a plurality of magnetoresistance (xMR) elements. The plurality of xMR elements may include tunneling magnetoresistance (TMR) elements. The plurality of xMR elements may include giant magnetoresistance (GMR) elements. The plurality of xMR elements may include anisotropic magnetoresistance (AMR) elements. The high-current conductor structure may be connected to a second heat sink. The first current may be greater in magnitude than the second current. The first current may include an AC current. The first current may include a DC current. The second current may include an AC or DC current.

Another general aspect of the present disclosure includes a method of making a power module conductor structure with integrated current sensor. The method can include: providing a high-current conductor structure having a main current path including an S-notch portion configured to mitigate eddy currents; providing a low-current conductor structure configured for connection to a heat sink and having a main current path; and providing a differential current sensor including one or more magnetic field sensing elements, where the differential current sensor is configured to detect current flowing in the high-current conductor structure.

Implementations may include one or more of the following features. The method where the S-notch portion may include a first current-redirection portion including a current path substantially transverse to a first input current path and a second current-redirection portion connected to the first current-redirection portion and including a current path substantially transverse to a second input current path. The power converter can be configured to convert power between a high current in the high-current conductor structure and a low current in the low-current conductor structure. The method may include an insulator disposed between the high-current conductor structure and the low-current conductor structure. The high-current conductor structure, the insulator, and the low-current conductor structure may include, compose, or be formed from a direct bonded copper substrate. The high-current conductor structure may include a direct bonded copper substrate. The low-current conductor structure may include a direct bonded copper substrate. The method may include connecting the low current conductor structure to the heat sink. The method may include connecting the high current conductor structure to a second heat sink. The differential current sensor may include a plurality of magnetoresistance (xMR) elements. The differential current sensor may include a plurality of Hall effect elements or plates.

A further general aspect includes a conductor structure with integrated current sensor. The conductor structure can include: a high-current conductor structure configured for connection to a power converter and having a main current path configured to conduct a first current, where the main current path includes an S-notch portion configured to mitigate eddy currents; a low-current conductor structure configured for connection to the power converter and having a main current path configured to conduct a second current, where the low-current conductor structure is connected to a first heat sink and; and a differential current sensor connected to the low-current conductor structure and including one or more magnetic field sensing elements, where the differential current sensor is configured to detect current flowing in the high-current conductor structure.

Implementations may include one or more of the following features. The S-notch portion may include a first current-redirection portion including a current path substantially transverse to a first input current path and a second current-redirection portion connected to the first current-redirection portion and including a current path substantially transverse to a second input current path. The differential current sensor may have a longitudinal axis and first and second magnetic field sensing elements aligned on the longitudinal axis. The longitudinal axis of the differential sensor can be aligned with a longitudinal axis of the main current path of the high-current conductor structure. The longitudinal axis of differential current sensor may be aligned with the longitudinal axis of the high-current conductor structure within a rotation angle ranging from about 1 degree to about 15 degrees about an axis normal to the longitudinal axis of the high-current conductor structure. The high-current conductor structure may include a direct bonded copper substrate. The low-current conductor structure may include first and second planar conductive layers and an insulator layer disposed between the first and second planar conductive layers. The low-current conductor structure may include or be formed from a direct bonded copper structure. The high-current conductor structure may include first and second planar conductive layers and an insulator layer disposed between the first and second planar conductive layers, where the first planar conductive layer includes the main current path.

The features and advantages described herein are not all-inclusive; many additional features and advantages will be apparent to one of ordinary skill in the art in view of the drawings, specification, and claims. Moreover, it should be noted that the language used in the specification has been selected principally for readability and instructional purposes, and not to limit in any way the scope of the present disclosure, which is susceptible of many embodiments. What follows is illustrative, but not exhaustive, of the scope of the present disclosure.

BRIEF DESCRIPTION OF THE DRAWINGS

The manner and process of making and using the disclosed embodiments may be appreciated by reference to the figures of the accompanying drawings. It should be appreciated that the components and structures illustrated in the figures are not necessarily to scale, emphasis instead being placed upon illustrating the principals of the concepts described herein. Furthermore, embodiments are illustrated by way of example and not limitation in the figures, in which:

FIGS. 5A-5C show top views of different examples of eddy current blockers, in accordance with the present disclosure;

FIG. 8 shows steps in an example method of making a power module conductor structure with integrated current sensor and eddy current mitigation, in accordance with the present disclosure.

DETAILED DESCRIPTION

The features and advantages described herein are not all-inclusive; many additional features and advantages will be apparent to one of ordinary skill in the art in view of the drawings, specification, and claims. Moreover, it should be noted that the language used in the specification has been selected principally for readability and instructional purposes, and not to limit in any way the scope of the inventive subject matter. The subject technology is susceptible of many embodiments. What follows is illustrative, but not exhaustive, of the scope of the subject technology.

Aspects of the present disclosure are directed to and include systems, circuits, and methods providing power modules and conductive structures having eddy current mitigation structures, e.g., formed as S-notches (referencing the general shape of the notches with "S"-shaped or serpentine paths), and integrated current sensors. Examples and embodiments can include heat sinks. Examples and embodiments can be used for power modules, e.g., in EV and/or hybrid vehicle applications.

Figure 1:
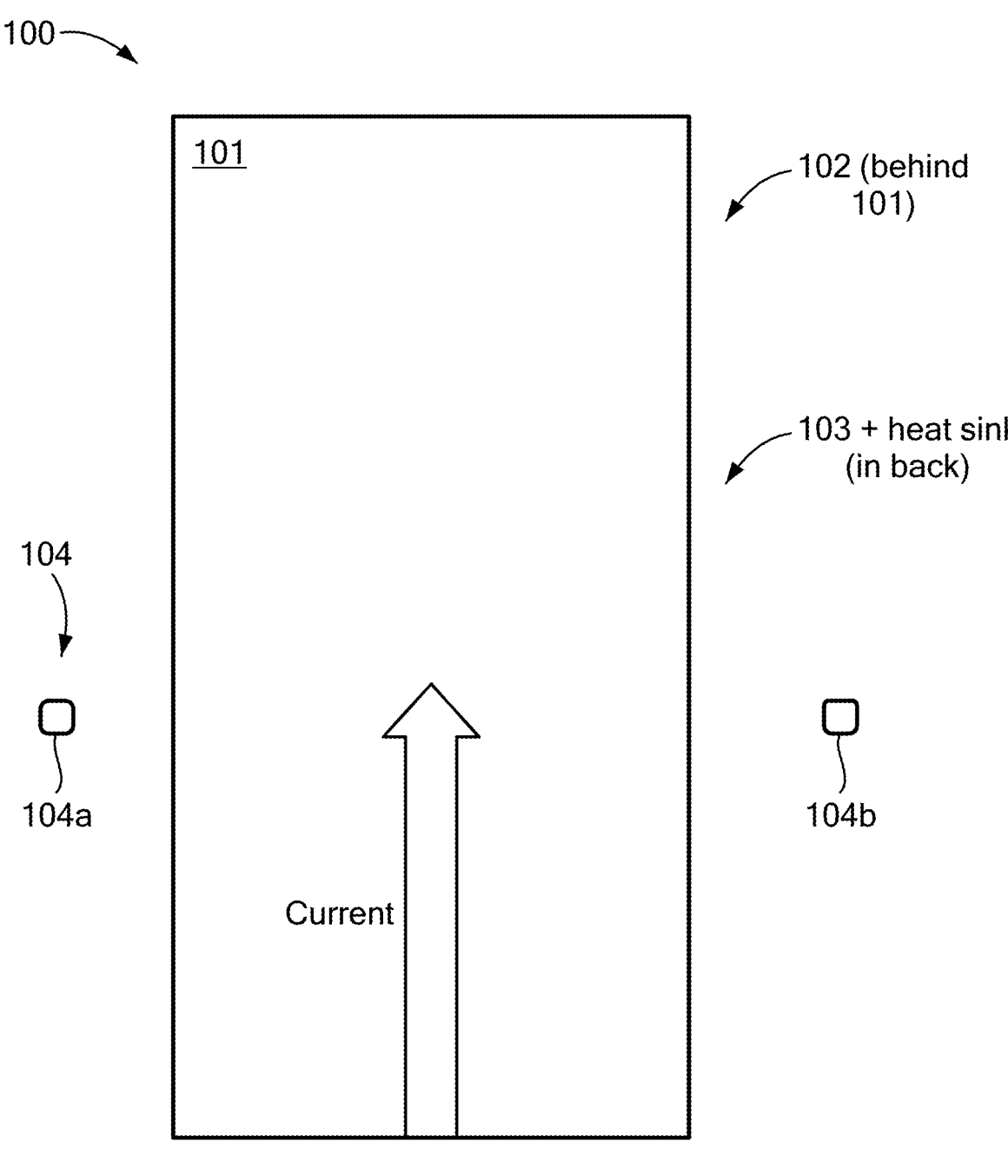
FIG. 1 diagram of is a diagram of a prior art planar conductor structure with current sensor used for EV power module applications.
Figure 2A:
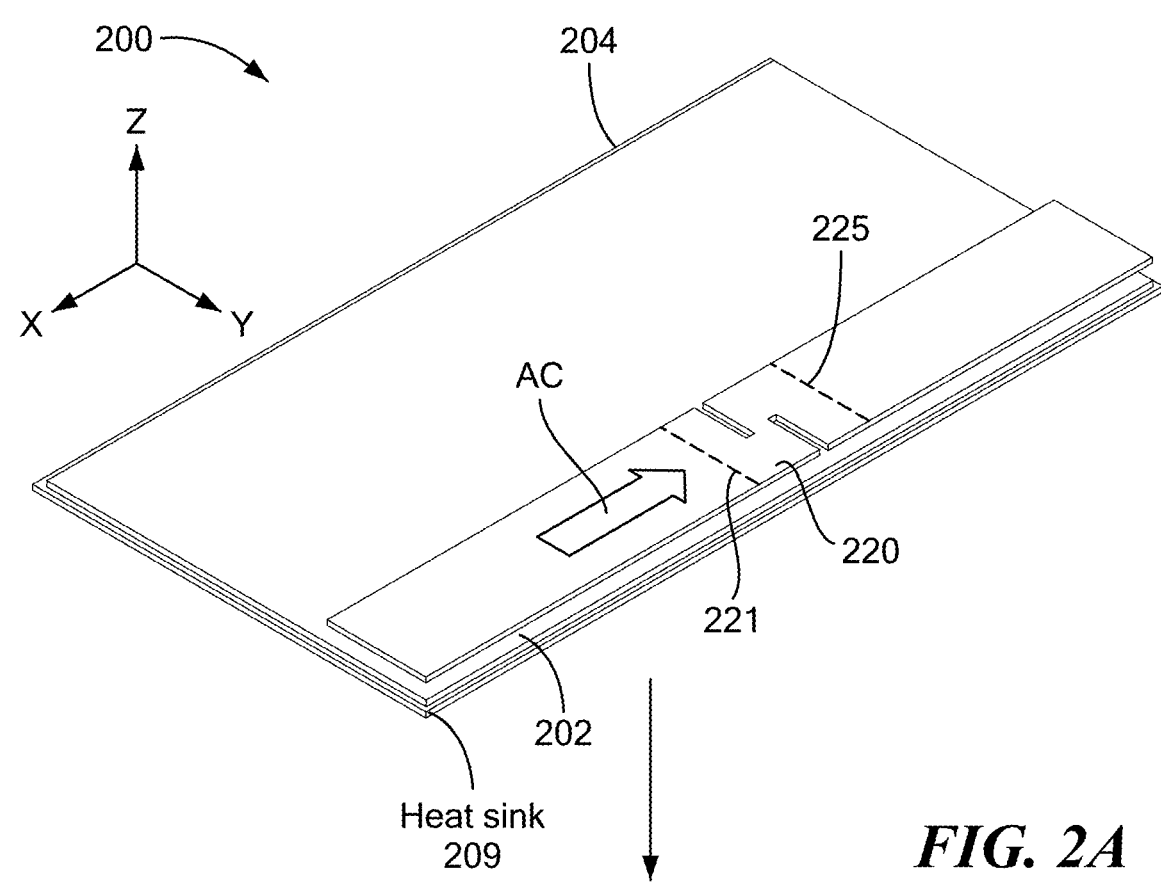
FIGS. 2A-2B show perspective and top views, respectively, of an example conductor structure having an S-notch for eddy current mitigation and an integrated current sensor, in accordance with the present disclosure.
Figure 2B:
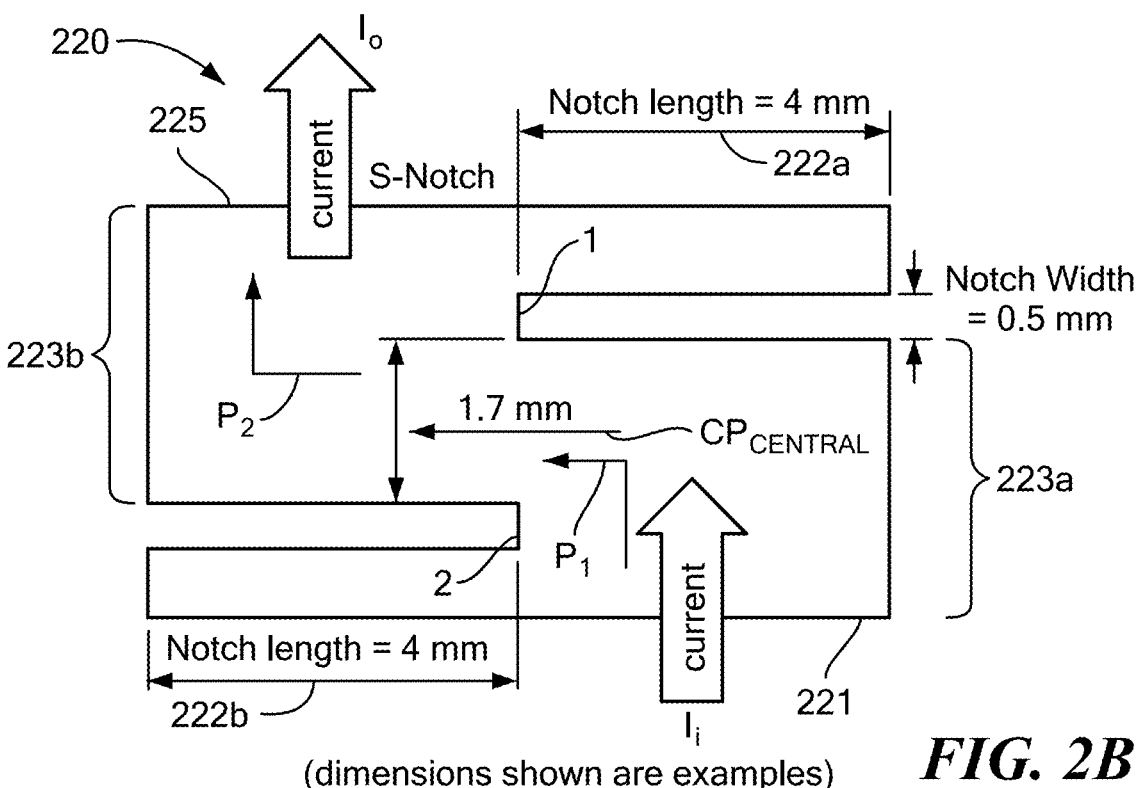

FIGS. 2A-2B show perspective and top views, respectively, of an example conductor structure 200 having an S-notch for eddy current mitigation and an integrated current sensor, in accordance with the present disclosure.

As shown in FIG. 2A, structure 200 can include first and second conductors 202, 204. In some embodiments first and second conductors 202 and 204 may have planar shapes. An insulator or isolator (not shown) may be positioned between the first and second conductors 202, 204. In some embodiments, an insulator layer may include aluminum oxide and/or aluminum nitride. In some embodiments, first and second conductors 202, 204 and an interposed insulator layer may comprise (be formed by) a direct bonded copper (DBC) substrate. Structure 200 can include a heat sink 209. In some embodiments, heat sink 209 may include a liquid-cooled heatsink, e.g., a metal conduit carrying circulating water or the like. First conductor 202 can also include an S-notch structure (a.k.a., "S-notch") 220 that operates to mitigate eddy currents, described in further detail below for FIG. 2B.

As shown in FIG. 2B, S-notch 220 can include an input region (a.k.a., input) 221, first and second notches 222*a-b*, and an output region (a.k.a., output) 225. S-notch 220 further include a first current-redirection portion 223*a* including a first (output) current path substantially transverse to a first (input) current path (shown by path $P_1$) and a second current-redirection portion 223*b* connected to the first current-redirection portion 223*a* and including a second (output) current path substantially transverse to a second (input) current path (shown by path $P_2$). Of course, the geometry of notches 222*a-b* may be varied withing the scope of the present disclosure, e.g., the notch length and/or width may be greater or lesser than as shown and/or the positions of notches 222*a-b* may be switched with respect to the vertical axis of the drawing. Positions 1 and 2 are shown for elements of an adjacent differential current sensor (e.g., see sensor 312 of FIG. 3). The differential current sensor elements are shown aligned (configured) parallel to the current path of the central portion (shown as $CP_{CENTRAL}$) of the S-notch 220; the parallel configuration of sensor elements (e.g., Hall plates) is insensitive to the magnetic fields produced by eddy currents in adjacent conductive structures including heat sinks.

Figure 3:
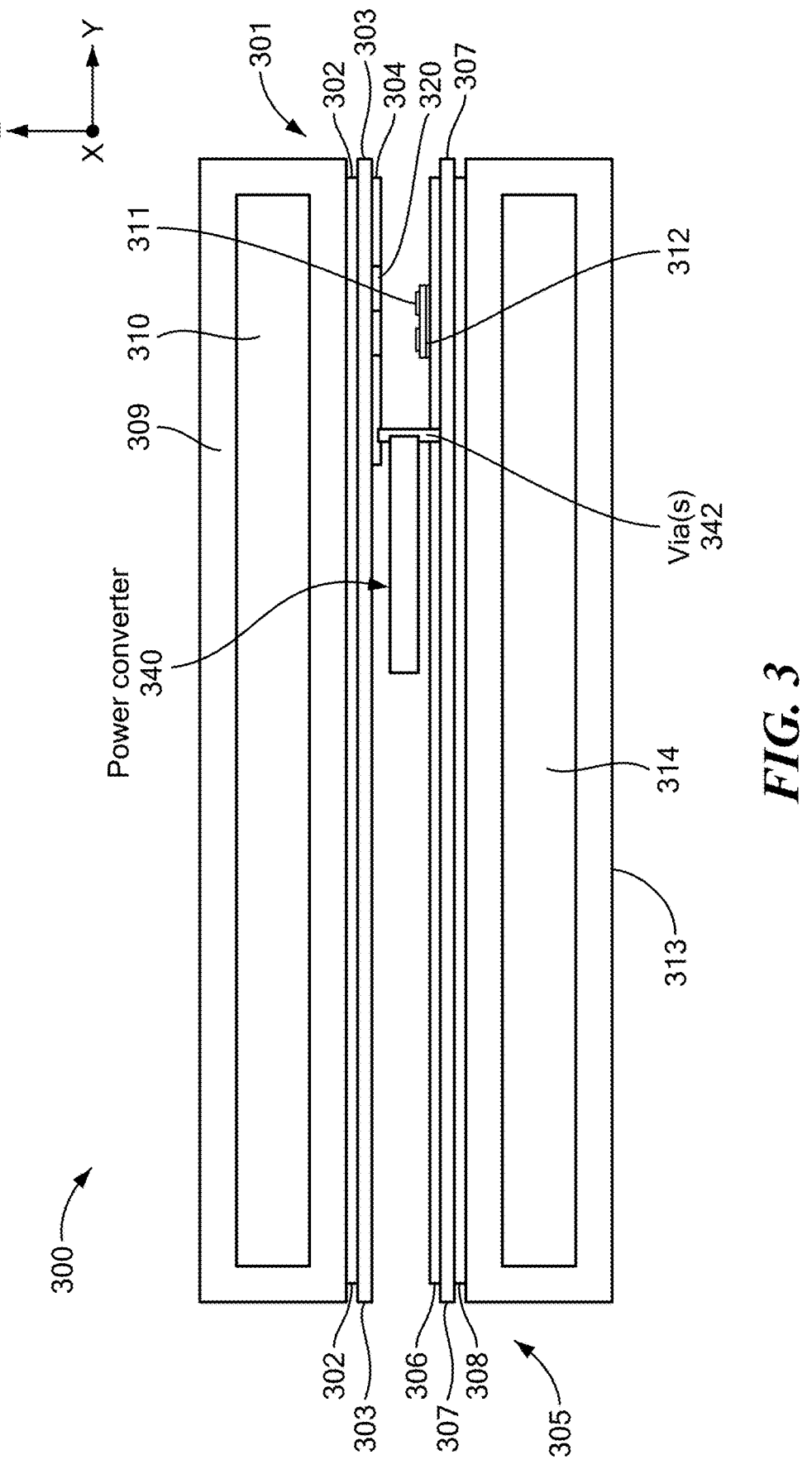
FIG. 3 shows a cross-sectional view of an example power module structure having a conductor with an S-notch and an integrated current sensor, in accordance with the present disclosure.

FIG. 3 shows a cross-sectional view of an example power module structure 300 having a conductor with an S-notch and an integrated current sensor, in accordance with the present disclosure.

Structure 300 includes a high-current conductor structure (first or high-current conductor) 301 and a low-current conductor structure (second or low-current conductor) 305. As shown, in some embodiments, high-current conductor structure 301 can include first and second planar conductors 302, 304 separated by an insulator 303. The first (high-current) conductor can include a main current path having an S-notch structure 320 (similar to as shown and described for FIGS. 2A-2B) for eddy current mitigation.

Low-current conductor structure 305 is shown including first and second planar conductors 306, 308 separated by an insulator 307. The first and second conductors 301 and 305 can be connected to heat sinks 309 and 313, respectively. In some embodiments, heat sinks 309 and 313 can be liquid-cooled, having interior volumes 310 and 314, respectively, for carrying liquid, e.g., circulating water.

Structure 300 can further include a power converter 340 connected to the first and second conductors 301 and 305 by one or more vias 342 and/or other suitable electrical connections. The power converter 340 can include a plurality of semiconductor power switches and respective controllers, e.g., six transistors such as SiC or GaN MOSFETs with respective gate drivers configured for rectification of AC current to DC current and vice versa. In some embodiments, diodes may be used as semiconductor switches instead of or addition to transistors.

A current sensor 311 is shown mounted to second conductor 305, with optional interposed solder strip 312 shown. Current sensor 311 is configured to detect/sense current in the first conductor 301.

Current sensor 311 can include any suitable type of current sensing element(s). In some embodiments, current sensor 311 can include Hall effect elements. In some embodiments, current sensor 311 can include magnetoresistive (xMR) elements. In some embodiments, xMR elements can include tunneling magnetoresistive (TMR) elements, giant magnetoresistive (GMR) elements, or anisotropic magnetoresistive (AMR) elements.

Figures 4A, 4B, 4C:
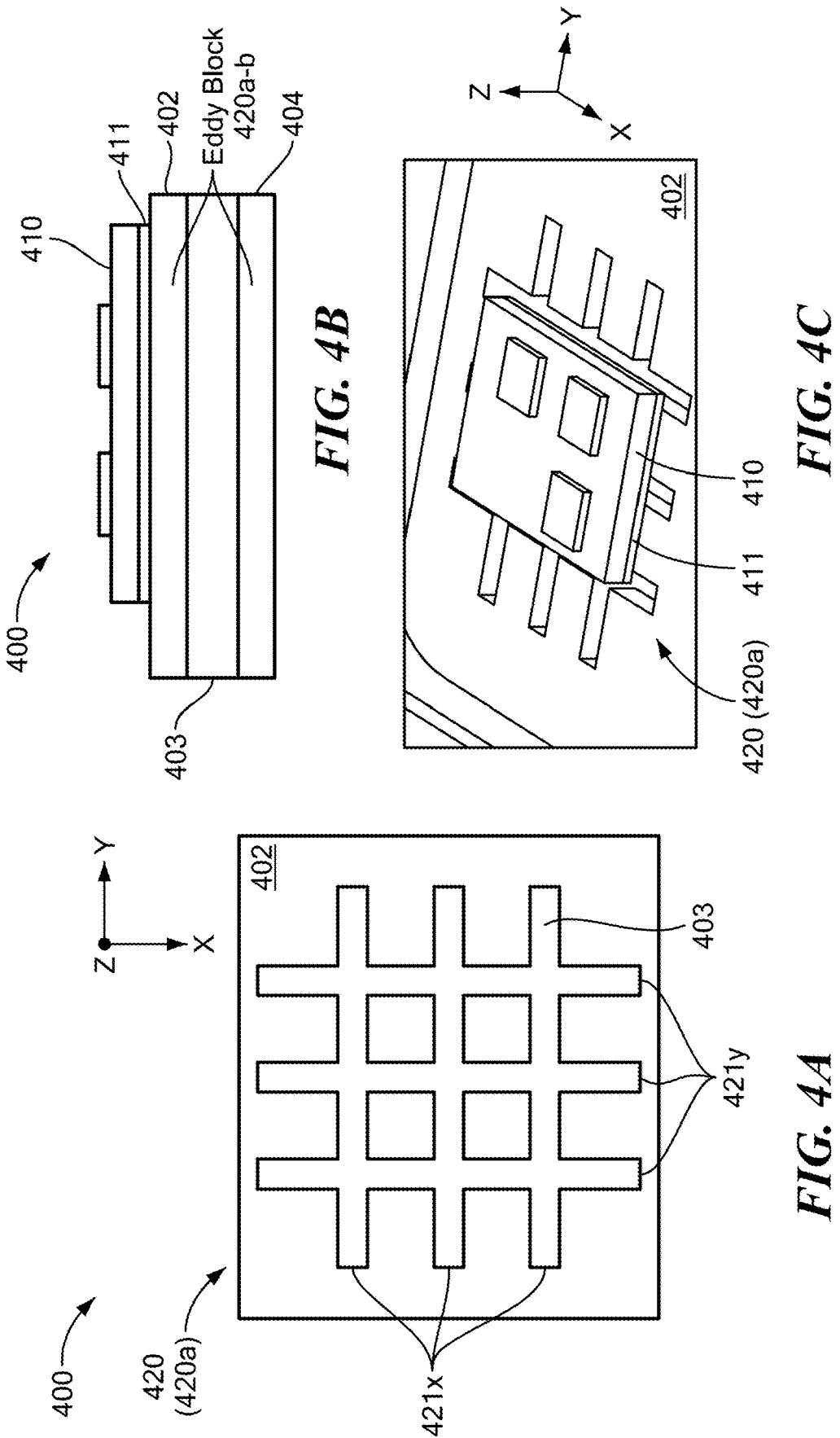
FIGS. 4A-4C show top, side, and perspective views, respectively, of an example conductor structure 400 having eddy current blockers 420 for use in conductors and power modules, in accordance with the present disclosure.

FIGS. 4A-4C show top, side, and perspective views, respectively, of an example conductive structure 400 having eddy current blockers 420 for use in conductors and power modules, in accordance with the present disclosure.

As shown in FIG. 4A, structure 400 can include a first conductor (conductive layer) 402 made of a suitable conductive material and configured as desired, e.g., a layer of copper. Conductor 402 is shown including a first plurality (set, group, or array) of slots (apertures) oriented in a first direction 421*x* and a second plurality (set, group, or array) of slots (apertures) oriented in a second direction 421*y*. Optional layer 403 is shown behind (underneath) conductor 402. In some embodiments, layer 403 may be an isolation/insulation layer, e.g., aluminum oxide, aluminum nitride, or the like. The slots 421*x* and 421*y* can beneficially block eddy currents in conductor 402. A second conductor (conductive layer) 404 (not shown) may be present behind (underneath) insulator layer 403.

While slots 421*x* are shown as being uniform and parallel they are not necessarily so in other embodiments; in other words, there can be variations in thickness and orientation between those slots. Similarly, while slots 421*x* are shown as being uniform and parallel they are not necessarily so in other embodiments; in other words, there can be variations in thickness and orientation between those slots. It will be understood by a skilled artisan that while slots 421*x* are shown as being perpendicular to slots 421*y*, the two pluralities (sets, groups, or arrays) of slots may cross or intersect at angles other than right angles. Some embodiments may include just a single plurality (set or group) of slots. In other embodiments, more than two pluralities (e.g., three pluralities) of slots may be present and configured to intersect at desired respective angles.

FIG. 4B shows a cross section of structure 400. As shown in FIG. 4B, conductor 402 with eddy current blocker 420 may be included in a structure 400 for a power module or power module structure, e.g., similar to structure 300 shown and described for FIG. 3. Insulator (isolator) layer 403 can be disposed/positioned between conductor 402 and conductor 404. As noted, conductor 402 can include eddy current blocker 420 (indicated in FIG. 4B as 420*a*). Conductor 404 can also (optionally) include a similar eddy current blocker (indicated as 420*b*). In some embodiments, magnetic field sensor 410 can be present, e.g., mounted on a base layer/substrate 411 of solder or other suitable adhesive. Magnetic field sensor 410 can include any suitable magnetic field sensing elements, e.g., Hall effect, xMR, etc., and may be configured to measure current in any desired orientation(s) or number of dimensions (e.g., 1D, 2D, or 3D). In some embodiments, first and second conductors 402 and 404 and insulator layer 403 can be provided by or formed from a direct bonded copper (DBC) substrate.

FIG. 4C shows a perspective view of structure 400 with magnetic field sensor 410 mounted on conductor 402, with eddy current blocker 420 (420*a*) shown in conductor 402.

FIGS. 5A-5C show top views of different examples 500A-500C of eddy current blockers, in accordance with the present disclosure.

FIG. 5A shows eddy current blocker 500A in conductor 502. Eddy current blocker 500A is shown having a first plurality of slots 504*x* and a second plurality of slots 504*y*, with a geometry similar to that of eddy current blocker 420*a* shown for FIG. 4A. Slots 504*x* are shown having extensions 505*x* extending in conductor 502 from the intersections with slots 504*y*. Slots 504*y* are shown having extensions 505*y* extending from the intersections with slots 504*x*. The dimensions of extensions 505*x*, 505*y*, can be selected/formed as desired; and the dimensions may be uniform or vary for slots 504*x* and/or 505*y*.

FIG. 5B shows eddy current blocker 500B, with slots 504*x* and 504*y* having a geometry different than those of eddy current blocker 500A. As shown, extensions 505*x* and 505*y* can be designed/selected as desired. Moreover, the thickness of slots 504*x* and 504*y* can be selected as desired, e.g., as shown by greater thickness (width) in FIG. 5B compared to FIG. 5A.

FIG. 5C shows eddy current blocker 500C, having a geometry with a greater number of slots 504*x* and 504*y*, respectively, than as shown for FIGS. 5A-5B.

While certain eddy current blockers with certain geometries are shown and described for FIGS. 4A-4B and 5A-5C, eddy current blockers may have different geometries in other embodiments of the present disclosure. For example, eddy current blockers may be formed by an array (collection or grouping) of spaced-apart conductive structures and/or apertures formed in a planar conductor, e.g., an array of apertures or solid regions rectangles, polygons, or ellipses formed in a planar conductor; such arrays (collections or groupings) may have a uniform and regular distribution of elements or the elements may have non-uniform distribution.

Figures 6A, 6B:
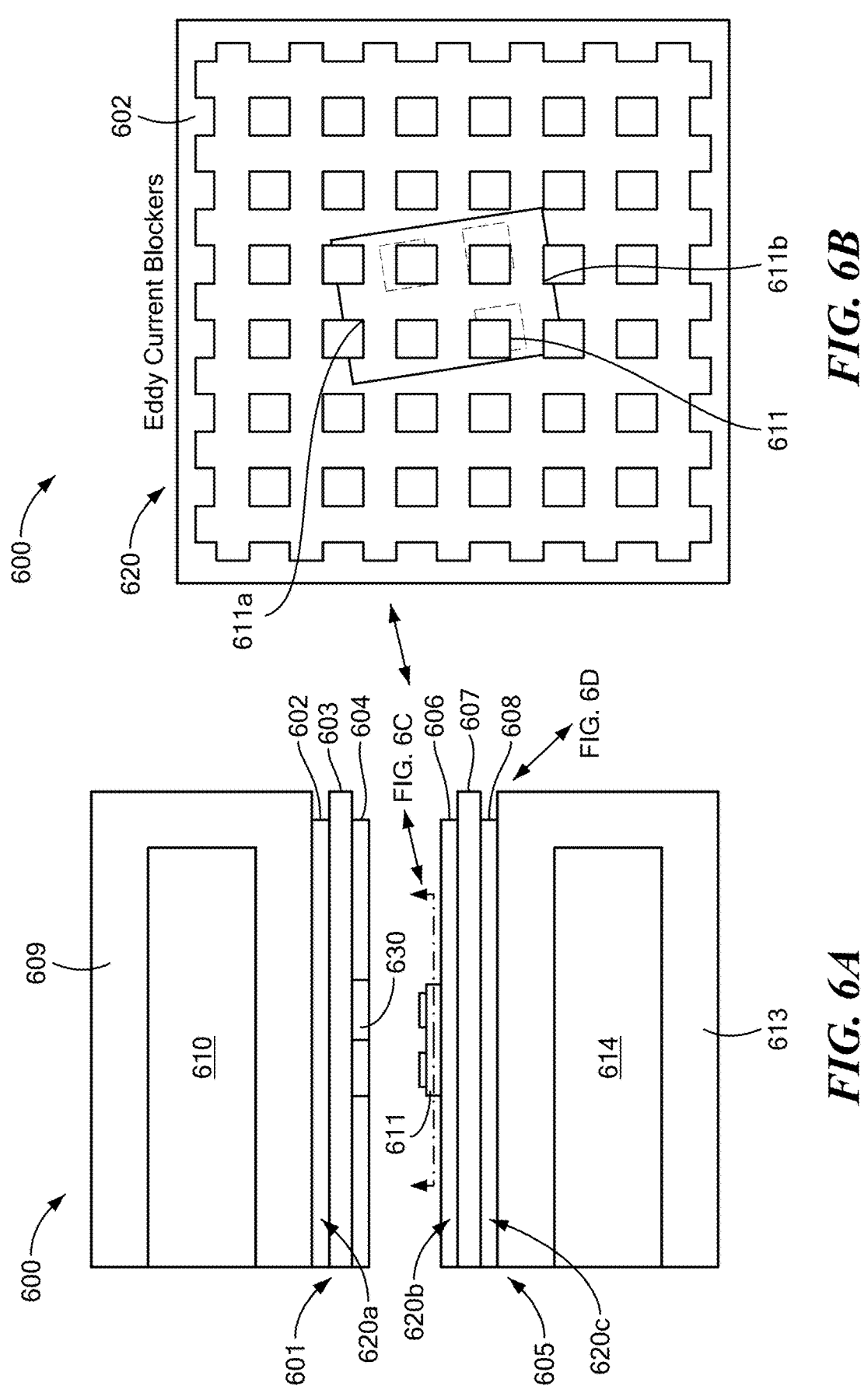
FIGS. 6A-6D show views of another example power module structure, in accordance with the present disclosure, with FIG. 6A showing a cross-sectional view, FIG. 6B showing a plan view of a current sensor mounted on a low-current conductor structure having an eddy current blocker, FIG. 6C showing a section view of the current sensor in relation to a high-current conductor structure having an S-notch, and FIG. 6D showing a cross-section view of a detail of the low-current conductor structure.
Figure 6C:
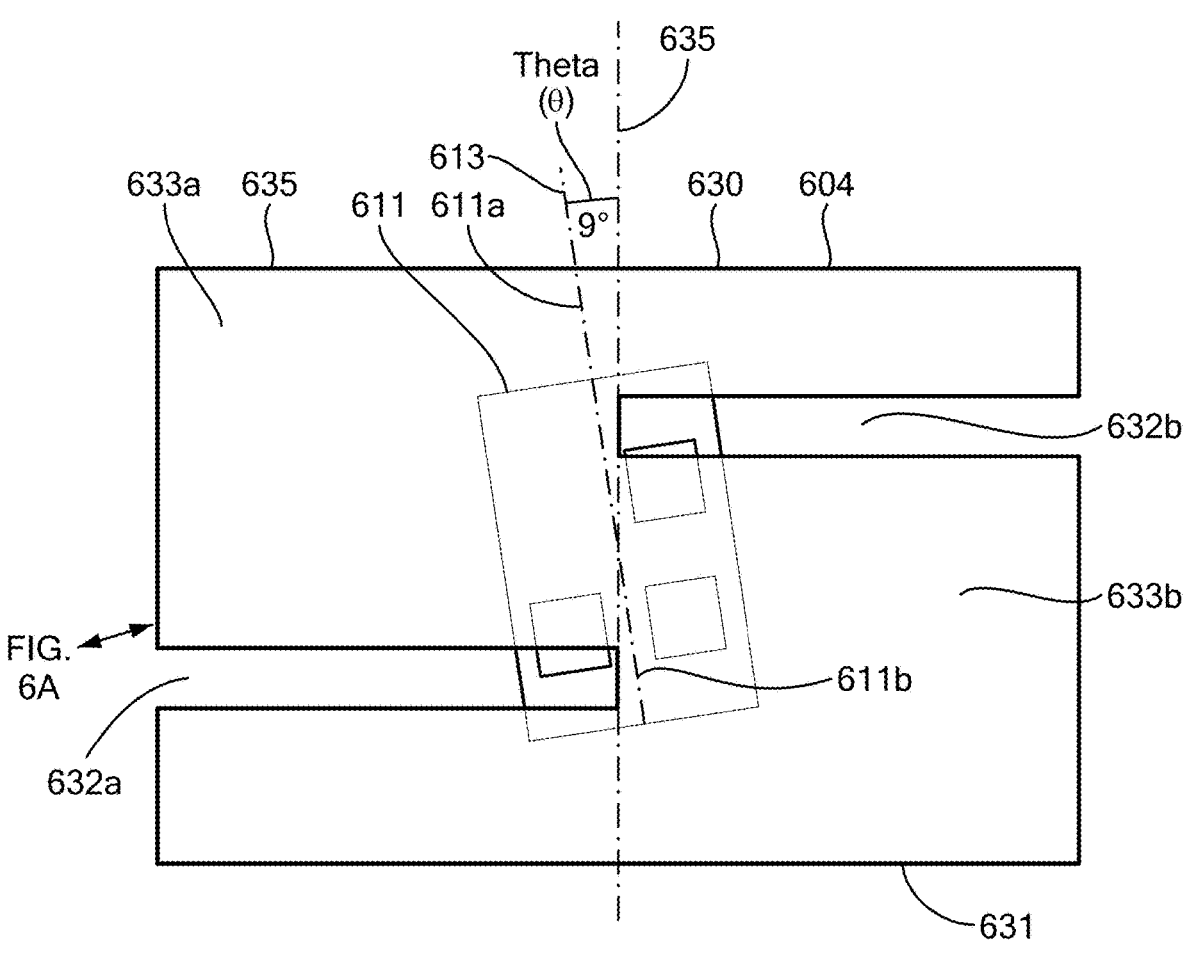
Figure 6D:
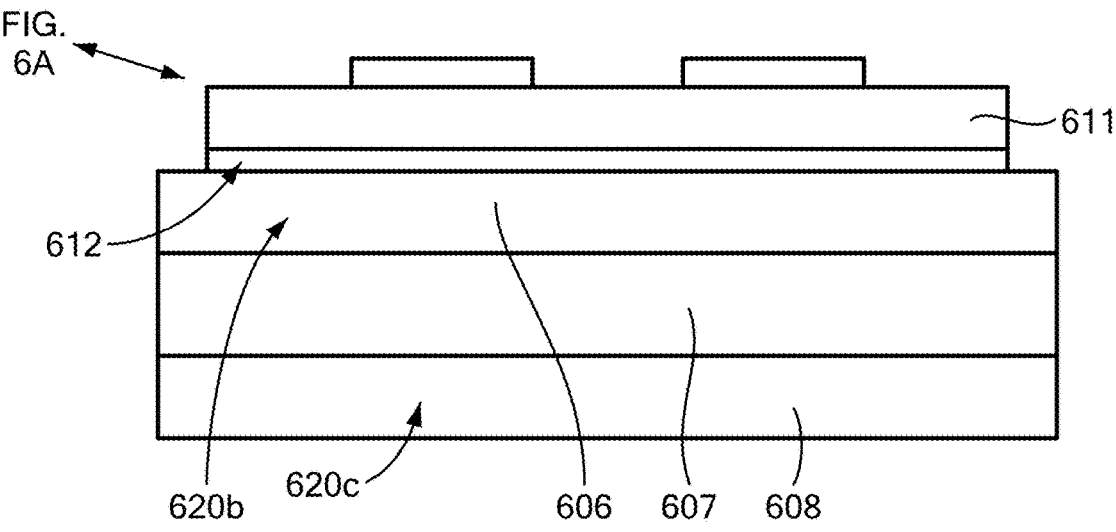

FIGS. 6A-6D show views of another example power module (power module structure), in accordance with the present disclosure, with FIG. 6A showing a cross-sectional view, FIG. 6B showing a plan view of a current sensor mounted on a low-voltage conductor structure having an eddy current blocker, FIG. 6C showing a section view of the current sensor in relation to a high-current conductor structure having an S-notch, and FIG. 6D showing a cross-section view of a detail of the low-voltage conductor structure.

FIG. 6A shows a cross-sectional view of power module 600. Power module (power module structure) 600 includes a high-current conductor structure 601 and a low-current conductor structure 605. As shown, in some embodiments, high-current conductor structure 601 can include first and second planar conductors 602, 604 separated by an insulator 603. It will be understood that while planar conductors 602 and 604 are referred to as "first" and "second," the order of naming is arbitrary and may be revered. Moreover, planar conductors 602 and 604 may be referred to a "conductor structures" or simply "conductors." High-current conductor structures 601 can be connected to heat sinks 609, in some embodiments. In some embodiments, planar conductors 602 and 604 interposed insulator layer 603 may include (be formed by) a direct bonded copper (DBC) substrate. In some embodiments, heat sink 609 can be liquid-cooled, having interior volume for carrying liquid, e.g., circulating water. As described below, in some embodiments, high-current conductor structure 601 may optionally include one or more eddy current blockers (similar to as described for FIGS. 3A-3B) in one or both planar conductors 602, 604, with eddy current blocker 620*a* indicated for planar conductor 602.

The high-current conductor structure 601 can also include an S-notch structure 630 (e.g., similar to as shown and described for FIGS. 2A-2B), e.g., as shown in second planar conductor 604, for eddy current mitigation.

Low-current conductor structure 605 is shown including first and second planar conductors 606, 608 separated by an insulator 607. Differential current sensor 611 is shown disposed on planar conductor 606 and configured for detecting current in S-notch structure (a.k.a., portion) 630. Differential sensor 611 includes a plurality of magnetic field sensing elements, e.g., elements 611*a-b* (shown in FIGS. 6B-6C). It will be understood that while planar conductors 606 and 608 are referred to as "first" and "second," the order of naming is arbitrary and may be revered. Moreover, planar conductors 606 and 608 may be referred to a "conductor structures" or simply "conductors." In some embodiments, planar conductors 606 and 608 interposed insulator layer 607 may include (be formed by) a direct bonded copper (DBC) substrate. Low-current conductive structure 605 can be connected to heat sink 613. In some embodiments, heat sink 613 can be liquid-cooled, having interior volume 614 for carrying liquid, e.g., circulating water. In some embodiments, low-current conductor structure 605 may optionally include one or more eddy current blockers (e.g., similar to as described for FIGS. 3A-3B) in one or both planar conductors 606, 608, with eddy current blockers 620*b-c* indicated for planar conductors 606 and 608, respectively.

As shown in FIG. 6B, planar conductive layer 602 can include an eddy current blocker 620, e.g., similar to as shown and described for eddy current blocker 500B shown and described for FIG. 5B. Of course, in alternate embodiments, an eddy current blocker may be used, which has another suitable geometry. The orientation of differential current sensor 611 with field sensing elements 611*a-b* is shown.

FIG. 6C shows a section view of the differential current sensor 611 in relation to planar conductor 604 of high-current conductor structure 601, with S-notch 630 shown. S-notch 630 can include notches 632*a-b* and current-redirection portions 633*a-b*. S-notch 630 can include an input region and an output region, as indicated by plane sections 631 and 635, respectively.

As indicated, current sensor 611 can be mounted (configured) such that its longitudinal axis 613 is not collinear with a longitudinal axis 635 of S-notch 630 (in contrast with the configuration shown in FIG. 2B for sensor elements at positions 1 and 2). The angle (theta) formed between the axes may be selected as desired. Introduction of such an angle may increase or serve to optimize insensitivity of current sensor 611 to eddy currents in adjacent conductive structure(s) including heat sinks 609 and/or 613. For example, in some embodiments, theta may range from about one (1) degree to about 15 degrees, inclusive of end range values. As indicated, in some embodiments, theta may be equal to or approximately equal to 9 degrees, though other values (e.g., within 0 to 180 degrees) may be used within the scope of the present disclosure.

FIG. 6D shows a cross-section view of a detail of the low-current conductor structure 605. Structure 605 includes first and second planar conductors 606 and 608 on opposed sides of insulator (dielectric or isolator) 607. Planar conductors 606 and 608 may each include one or more eddy current blockers; example eddy current blockers are indicated as 620*b* and 620*c*, respectively. Current sensor (magnetic field sensor) 611 is shown mounted to planar conductor 606. Optional layer 612 of solder (or other suitable adhesive) is shown, facilitating mounting of magnetic field sensor. In some embodiments, current sensor 611 may be or include an integrated circuit (IC) with one or more magnetic field sensing elements and processing circuitry (e.g., a processor, memory, and/or buffer circuitry) for measuring current; in other embodiments, current sensor 611 may include an IC with one or more magnetic field sensing elements that can be used for calculating current by connection to remote circuitry (e.g., having a suitable processor, memory, and/or buffer circuitry).

Figure 7A:
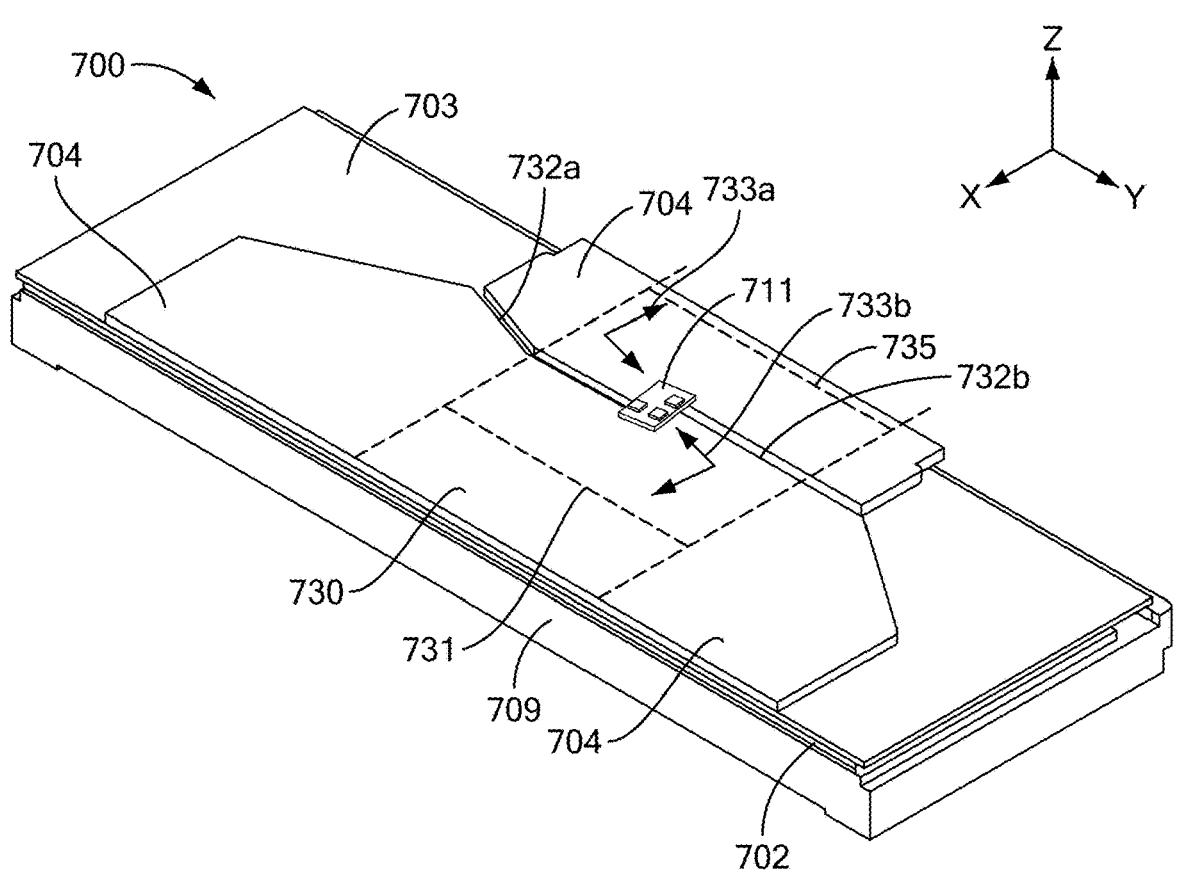
FIGS. 7A-7C show perspective, top, and cross-sectional views of an alternate embodiment of a power module with integrated current sensor and eddy current mitigation, in accordance with the present disclosure.
Figure 7B:
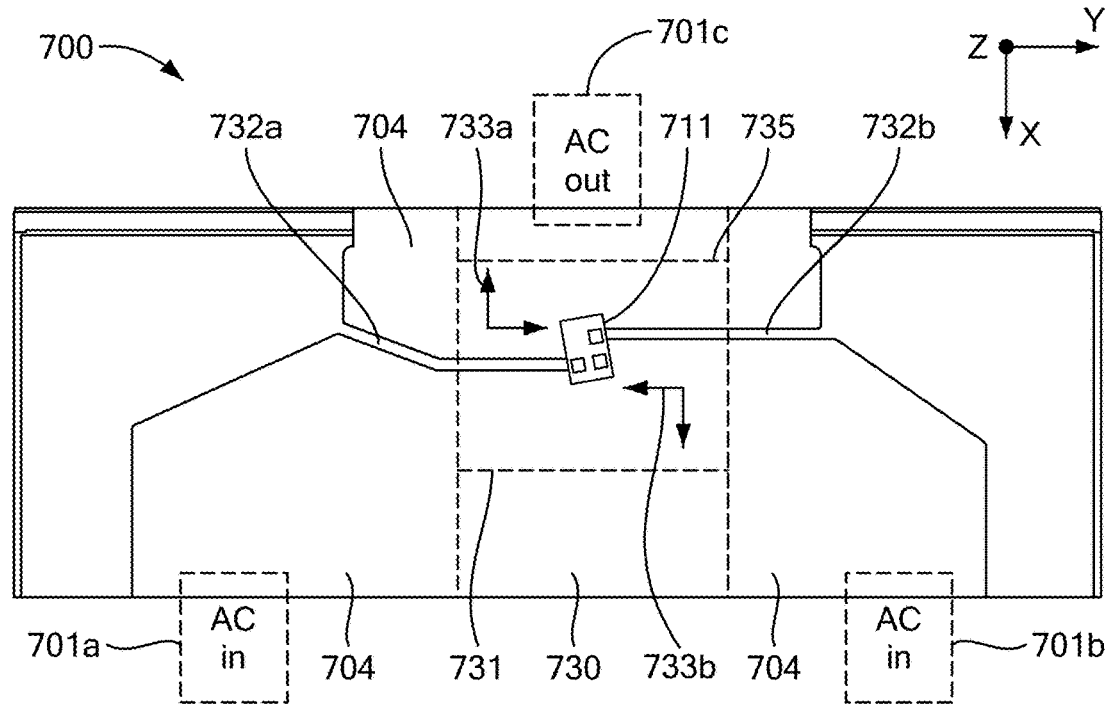
Figure 7C:
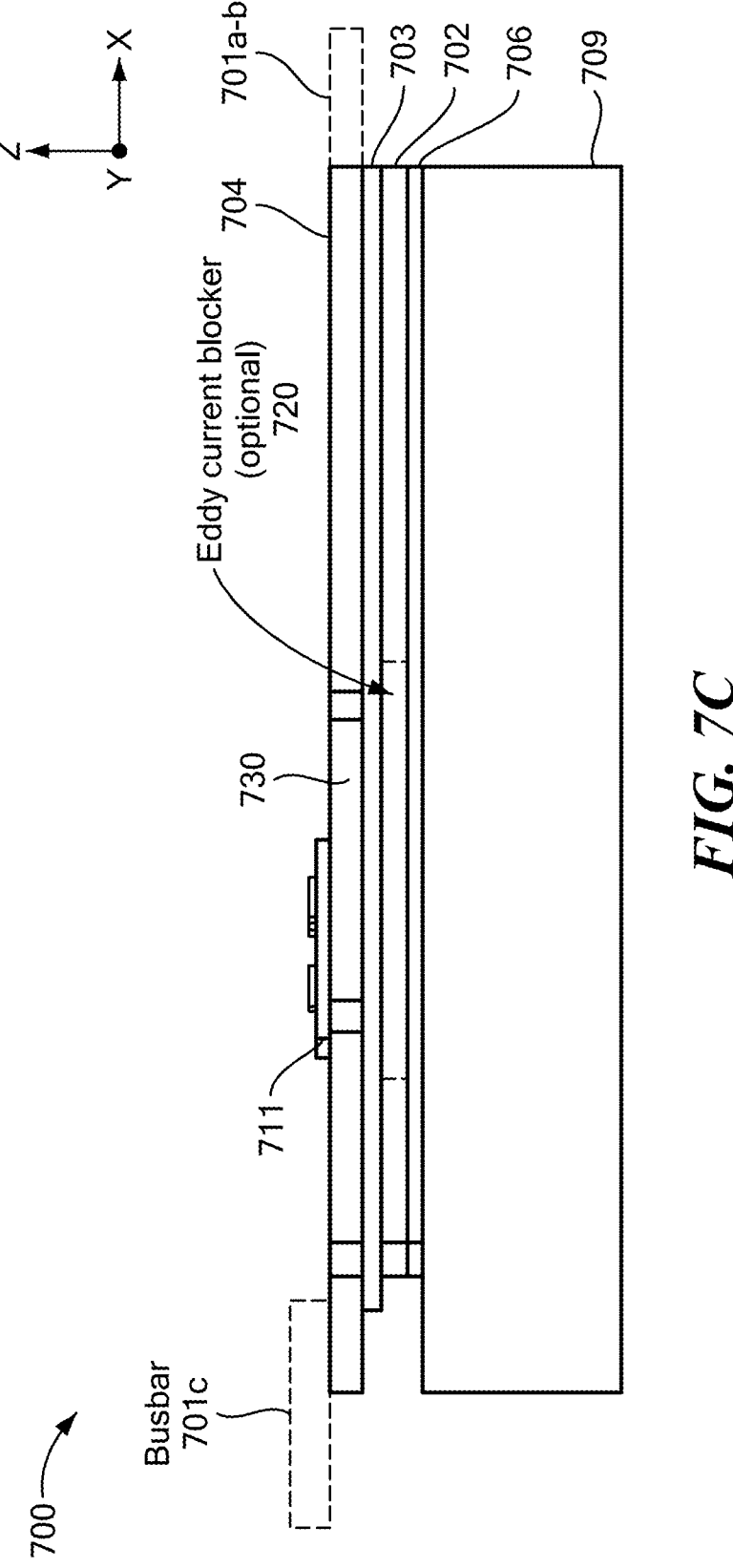

FIGS. 7A-7C show perspective, top, and cross-sectional views of an alternate embodiment of a power module conductor structure 700 with integrated current sensor and eddy current mitigation, in accordance with the present disclosure.

As shown in FIG. 7A, conductor structure 700 can include a low-current (first) planar conductor and high-current (second) planar conductors 702, 704 separated by an insulator 703. It will be understood that while planar conductors 702 and 704 are referred to as "first" and "second" is some instances herein, the order of naming is arbitrary and may be revered. Moreover, planar conductors 702 and 704 may be referred to a "conductor structures" or simply "conductors." Any suitable insulator material may be used for insulator 703. Examples include various ceramic materials, including but not limited to aluminum oxide and aluminum nitride; others may be used within the scope of the present disclosure. In some embodiments, planar conductors 702 and 704 interposed insulator layer 703 may include (be formed by) a direct bonded copper (DBC) substrate. Conductor structure 700 can include a heat sink 709, e.g., as shown attached to low-current planar conductor 702. A differential current sensor 711 can be mounted/configured to detect current flowing the conductor structure 700, e.g., flowing in high-current conductor 704. Differential current sensor 711 can include multiple magnetic field sensing elements (not shown); the field sensing elements (e.g., Hall plates or xMR elements) can be aligned along a longitudinal axis of sensor 711 (similar to as shown for sensor 611 shown in FIGS. 6B-6C). One or more busbars or other suitable electrical connections or conductors can provide input and output current paths for conductor structure 700, e.g., as shown in FIGS. 7B-7C.

High-current conductor 704 can include an S-notch 730 for eddy-current mitigation, e.g., along a main current path, as shown. S-notch 730 includes an input region (a.k.a., input) 731, first and second notches 732*a-b*, and an output region (a.k.a., output) 735. S-notch 730 can further include a first current-redirection portion 733*a* including a first (output) current path substantially transverse to a first (input) current path and a second current-redirection portion 733*b* connected to the first current-redirection portion 732*a* and including a second (output) current path substantially transverse to a second (input) current path. In operation, S-notch can mitigate (reduce or eliminate) or facilitate reductions of generation of eddy currents, particularly at higher frequencies, in the conductor structure 700, including the heat sink 709.

FIG. 7B shows a top view of conductor structure 700. As shown in FIG. 7B, one or more busbars 701*a-c* or other suitable electrical connections can provide input and output current paths for conductor structure 700. Busbars 701*a-b* are shown as current (e.g., AC) inputs while busbar 701*c* is shown as a current (e.g., AC) output. S-notch 730 can include an input region and an output region, as indicated by representative plane sections 731 and 735, respectively. It will be understood that the input and output regions 731 and 735 represent areas through which current flows into and out of S-notch 730 and depend on the geometry used for the S-notch 730 and connected conductive structures(s), e.g., high-current conductor 704; the regions shown are representative.

FIG. 7C shows a cross-section view of conductor structure 700. As shown in FIG. 7C, in some embodiments, a material layer 706 may be interposed (position between) low-current conductor structure 702 and heat sink 709 to facilitate connection between the conductor structure and heat sink 709. In some embodiments, material layer 706 can include a thermally-conductive epoxy or other suitable adhesive and/or thermally-conductive material. In some embodiments, an adhesive material (not shown) may be included between current sensor 711 and high-current conductor 704.

FIG. 8 shows steps in an example method 800 of making a power module conductor structure with integrated current sensor and eddy current mitigation, in accordance with the present disclosure. Method 800 can include providing a high-current conductor or conductor structure having a main current path, wherein the main current path includes an S-notch portion configured to mitigate eddy currents, as described at 802. Providing a low-current conductor or conductor structure configured for connection to a first heat sink and having a main current path, as described at 804. A power converter can optionally be provided that is connected to the high-current conductor and the low-current conductor, wherein the power converter is configured to convert power between the first current in the high-current conductor and the second current in the low-current conductor, as described at 806. A differential current sensor can be provided that is configured to detect current flowing in the high-current conductor, e.g., the S-notch portion or structure, as described at 808. In some embodiments, the differential current sensor can include one or more magnetoresistance (xMR) elements used as magnetic field sensors; the nomenclature "xMR" can generally refer to different types of MR elements, e.g., TMR, GMR, AMR, etc. In some embodiments, the differential current sensor can include one or more Hall effect elements (Hall plates). In some embodiments, the differential current sensor can include a plurality of magnetic field sensing elements (e.g., Hall effect or xMR) configured as a bridge, e.g., Wheatstone bridge, half-bridge, etc.

The S-notch portion of the high-current conductor can include or can be formed to include a first current-redirection portion including a current path substantially transverse to a first input current path and a second current-redirection portion connected to the first current-redirection portion and including a current path substantially transverse to a second input current path, as described at 810. Method 800 can include connecting the low-current conductor to the first heat sink, as described at 812. In some embodiments, method 800 can optionally include connecting the high-current conductor to a second heat sink.

Figure 9:
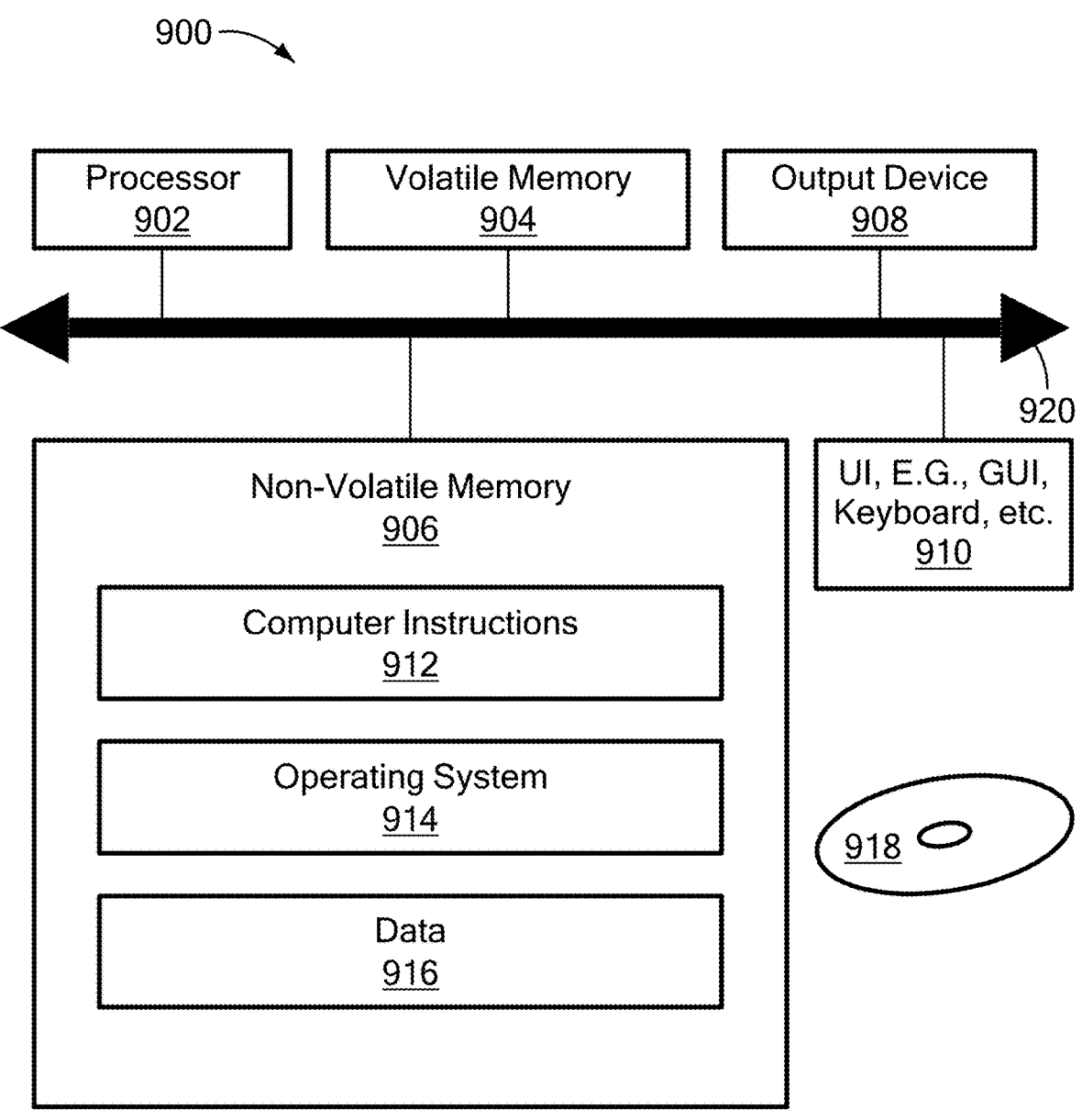
FIG. 9 is a block diagram of an example computer system operative to perform processing, in accordance with the present disclosure.

FIG. 9 is a block diagram of an example computer system 900 operative to perform processing, in accordance with the present disclosure. Computer system 900 can perform all or at least a portion of the processing, e.g., steps in algorithms and methods, described herein, including but not limited to calculation of current based on signals from a current sensor and/or one or more magnetic field sensing elements. The computer system 900 includes a processor 902, a volatile memory 904, a non-volatile memory 906 (e.g., hard disk, etc.), an output device 908 and a user input or interface (UI) 910, e.g., graphical user interface (GUI), a mouse, a keyboard, a display, and/or any common user interface, etc. The non-volatile memory (non-transitory storage medium) 906 stores computer instructions 912 (a.k.a., machine-readable instructions or computer-readable instructions) such as software (computer program product), an operating system 914 and data 916. In some examples/embodiments, the computer instructions 912 can be executed by the processor 902 out of (from) volatile memory 904. In some examples/embodiments, an article 918 (e.g., a storage device or medium such as a hard disk, an optical disc, magnetic storage tape, optical storage tape, flash drive, etc.) includes or stores the non-transitory computer-readable instructions. Bus 920 is also shown. In some embodiments, one or more components of system 900 can be disposed on or connected to one or more integrated circuits on one or more semiconductor die.

Processing may be implemented in hardware, software, or a combination of the two. Processing may be implemented in computer programs (e.g., software applications) executed on programmable computers/machines that each includes a processor, a storage medium or other article of manufacture that is readable by the processor (including volatile and non-volatile memory and/or storage elements), and optionally at least one input device, and one or more output devices. Program code may be applied to data entered using an input device or input connection (e.g., a port or bus) to perform processing and to generate output information.

The system 900 can perform processing, at least in part, via a computer program product or software application, (e.g., in a machine-readable storage device), for execution by, or to control the operation of, data processing apparatus (e.g., a programmable processor, a computer, or multiple computers). Each such program may be implemented in a high-level procedural or object-oriented programming language to communicate with a computer system. The programs may be implemented in assembly or machine language. The language may be a compiled or an interpreted language and it may be deployed in any form, including as a stand-alone program or as a module, component, subroutine, or other unit suitable for use in a computing environment. A computer program may be deployed to be executed on one computer or on multiple computers at one site or distributed across multiple sites and interconnected by a communication network. A computer program may be stored on a storage medium or device (e.g., CD-ROM, hard disk, or magnetic diskette) that is readable by a general or special purpose programmable computer for configuring and operating the computer when the storage medium or device is read by the computer. Processing may also be implemented as a machine-readable storage medium, configured with a computer program, where upon execution, instructions in the computer program cause the computer to operate. Further, the terms "computer" or "computer system" may include reference to plural like terms, unless expressly stated otherwise.

Processing may be performed by one or more programmable processors executing one or more computer programs to perform the functions of the system. All or part of the system may be implemented as special purpose logic circuitry, e.g., an FPGA (field programmable gate array) and/or an ASIC (application-specific integrated circuit). In some examples, digital logic circuitry, e.g., one or more FPGAs, can be operative as one or more processors as described herein.

Accordingly, embodiments of the inventive subject matter can afford various benefits relative to prior art techniques. For example, embodiments and examples of the present disclosure can enable or facilitate e.g., power modules having integrated current sensors that have eddy current mitigation and thus robustness against eddy currents, including at higher frequencies of operation.

Various embodiments of the concepts, systems, devices, structures, and techniques sought to be protected are described above with reference to the related drawings. Alternative embodiments can be devised without departing from the scope of the concepts, systems, devices, structures, and techniques described.

It is noted that various connections and positional relationships (e.g., over, below, adjacent, etc.) may be used to describe elements and components in the description and drawings. These connections and/or positional relationships, unless specified otherwise, can be direct or indirect, and the described concepts, systems, devices, structures, and techniques are not intended to be limiting in this respect. Accordingly, a coupling of entities can refer to either a direct or an indirect coupling, and a positional relationship between entities can be a direct or indirect positional relationship.

As an example of an indirect positional relationship, positioning element "A" over element "B" can include situations in which one or more intermediate elements (e.g., element "C") is between elements "A" and elements "B" as long as the relevant characteristics and functionalities of elements "A" and "B" are not substantially changed by the intermediate element(s).

Also, the following definitions and abbreviations are to be used for the interpretation of the claims and the specification. The terms "comprise," "comprises," "comprising," "include," "includes," "including," "has," "having," "contains" or "containing," or any other variation are intended to cover a non-exclusive inclusion. For example, an apparatus, a method, a composition, a mixture, or an article that includes a list of elements is not necessarily limited to only those elements but can include other elements not expressly listed or inherent to such apparatus, method, composition, mixture, or article.

Additionally, the term "exemplary" means "serving as an example, instance, or illustration. Any embodiment or design described as "exemplary" is not necessarily to be construed as preferred or advantageous over other embodiments or designs. The terms "one or more" and "at least one" indicate any integer number (or, where context admits, fractional number) greater than or equal to one, i.e., one, two, three, four, etc. The term "plurality" indicates any integer number (or, where context admits, fractional number) greater than one. The term "connection" can include an indirect "connection" and a direct "connection".

References in the specification to "embodiments," "one embodiment, "an embodiment," "an example embodiment," "an example," "an instance," "an aspect," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it may affect such feature, structure, or characteristic in other embodiments whether explicitly described or not.

Relative or positional terms including, but not limited to, the terms "upper," "lower," "right," "left," "vertical," "horizontal, "top," "bottom," and derivatives of those terms relate to the described structures and methods as oriented in the drawing figures. The terms "overlying," "atop," "on top, "positioned on" or "positioned atop" mean that a first element, such as a first structure, is present on a second element, such as a second structure, where intervening elements such as an interface structure can be present between the first element and the second element. The term "direct contact" means that a first element, such as a first structure, and a second element, such as a second structure, are connected without any intermediary elements.

Use of ordinal terms such as "first," "second," "third," etc., in the claims to modify a claim element does not by itself connote any priority, precedence, or order of one claim element over another, or a temporal order in which acts of a method are performed but are used merely as labels to distinguish one claim element having a certain name from another element having a same name (but for use of the ordinal term) to distinguish the claim elements.

The terms "approximately" and "about" may be used to mean within ±20% of a target (or nominal) value in some embodiments, within plus or minus (±) 10% of a target value in some embodiments, within ±5% of a target value in some embodiments, and yet within ±2% of a target value in some embodiments. The terms "approximately" and "about" may include the target value. The term "substantially equal" may be used to refer to values that are within ±20% of one another in some embodiments, within ±10% of one another in some embodiments, within ±5% of one another in some embodiments, and yet within ±2% of one another in some embodiments.

The term "substantially" may be used to refer to values that are within ±20% of a comparative measure in some embodiments, within ±10% in some embodiments, within ±5% in some embodiments, and yet within ±2% in some embodiments. For example, a first direction that is "substantially" perpendicular to a second direction may refer to a first direction that is within ±20% of making a 90° angle with the second direction in some embodiments, within ±10% of making a 90° angle with the second direction in some embodiments, within ±5% of making a 90° angle with the second direction in some embodiments, and yet within ±2% of making a 90° angle with the second direction in some embodiments.

The disclosed subject matter is not limited in its application to the details of construction and to the arrangements of the components set forth in the following description or illustrated in the drawings. The disclosed subject matter is capable of other embodiments and of being practiced and carried out in various ways.

Also, the phraseology and terminology used in this patent are for the purpose of description and should not be regarded as limiting. As such, the conception upon which this disclosure is based may readily be utilized as a basis for the designing of other structures, methods, and systems for carrying out the several purposes of the disclosed subject matter. Therefore, the claims should be regarded as including such equivalent constructions as far as they do not depart from the spirit and scope of the disclosed subject matter.

Although the disclosed subject matter has been described and illustrated in the foregoing exemplary embodiments, the present disclosure has been made only by way of example. Thus, numerous changes in the details of implementation of the disclosed subject matter may be made without departing from the spirit and scope of the disclosed subject matter.

Accordingly, the scope of this patent should not be limited to the described implementations but rather should be limited only by the spirit and scope of the following claims.

All publications and references cited in this patent are expressly incorporated by reference in their entirety.

What is claimed is:

1. A power module with integrated current sensor, the power module comprising:

a higher-current conductor structure having a main current path configured to conduct a first current, wherein the main current path includes an S-notch portion configured to mitigate eddy currents;

a lower-current conductor structure connected to a first heat sink and having a main current path configured to conduct a second current, wherein the higher-current conductor structure is configured to conduct a higher current level than the lower-current conductor structure;

a power converter connected to the higher-current conductor structure and the lower-current conductor structure, wherein the power converter is configured to convert power between the first current in the higher-current conductor structure and the second current in the lower-current conductor structure; and a differential current sensor connected to the lower-current conductor structure, wherein the differential current sensor is configured to detect current flowing in the higher-current conductor structure, wherein the higher-current conductor structure comprises first and second planar conductive layers and an insulator layer disposed between the first and second planar conductive layers, wherein the first planar conductive layer includes the main current path.

2. The power module of claim 1, wherein the S-notch portion comprises a first current-redirection portion including a current path substantially transverse to a first input current path and a second current-redirection portion connected to the first current-redirection portion and including a current path substantially transverse to a second input current path.

3. The power module of claim 1, wherein the differential current sensor has a longitudinal axis and first and second magnetic field sensing elements aligned on the longitudinal axis.

4. The power module of claim 3, wherein the longitudinal axis of the differential current sensor is aligned with a longitudinal axis of the main current path of the higher-current conductor structure.

5. The power module of claim 3, wherein the longitudinal axis of the differential current sensor is aligned with the longitudinal axis of the higher-current conductor structure, within a rotation angle ranging from about 1 degree to about 15 degrees about an axis normal to the longitudinal axis of the higher-current conductor structure.

6. The power module of claim 5, wherein the rotation angle is between about 8 degrees and about 10 degrees.

7. The power module claim 1, wherein the higher-current conductor structure comprises a direct bonded copper substrate.

8. A power module with integrated current sensor, the power module comprising:

a higher-current conductor structure having a main current path configured to conduct a first current, wherein the main current path includes an S-notch portion configured to mitigate eddy currents;

a lower-current conductor structure connected to a first heat sink and having a main current path configured to conduct a second current, wherein the higher-current conductor structure is configured to conduct a higher current level than the lower-current conductor structure;

a power converter connected to the higher-current conductor structure and the lower-current conductor structure, wherein the power converter is configured to convert power between the first current in the higher-current conductor structure and the second current in the lower-current conductor structure; and a differential current sensor connected to the lower-current conductor structure, wherein the differential current sensor is configured to detect current flowing in the higher-current conductor structure, wherein the lower-current conductor structure comprises first and second planar conductive layers and an insulator layer disposed between the first and second planar conductive layers.

9. The power module claim 8, wherein the lower-current conductor structure comprises a direct bonded copper substrate.

10. A power module with integrated current sensor, the power module comprising:

a higher-current conductor structure having a main current path configured to conduct a first current, wherein the main current path includes an S-notch portion configured to mitigate eddy currents;

a lower-current conductor structure connected to a first heat sink and having a main current path configured to conduct a second current, wherein the higher-current conductor structure is configured to conduct a higher current level than the lower-current conductor structure;

a power converter connected to the higher-current conductor structure and the lower-current conductor structure, wherein the power converter is configured to convert power between the first current in the higher-current conductor structure and the second current in the lower-current conductor structure; a differential current sensor connected to the lower-current conductor structure, wherein the differential current sensor is configured to detect current flowing in the higher-current conductor structure; and one or more eddy current blockers disposed within the second planar conductive layer of the higher-current conductor structure.

11. The power module of claim 10, wherein the one or more eddy current blockers each comprises an array of spaced-apart conductive structures.

12. The power module of claim 10, wherein the S-notch portion is disposed in the first planar conductive layer of the higher-current conductor structure and the one or more eddy current blockers comprise a first eddy current blocker disposed in the second planar conductive layer of the higher-current conductor structure.

13. The power module of claim 1, further comprising one or more eddy current blockers disposed within the lower-current conductor structure.

14. The power module of claim 13, wherein the one or more eddy current blockers each comprises an array of spaced-apart conductive structures.

15. The power module of claim 13, wherein the one or more eddy current blockers is disposed in the first planar conductive layer and/or the second planar conductive layer of the lower-current conductor structure.

16. The power module of claim 1, wherein the power converter comprises one or more transistors configured to convert power between AC power and DC power.

17. The power module of claim 16, wherein the one or more transistors comprises a plurality of transistors configured as a bridge or half-bridge.

18. The power module of claim 17, wherein the plurality of transistors is configured as an inverter.

19. The power module of claim 1, wherein the power converter comprises one or more diodes configured to convert power between AC power and DC power.

20. The power module of claim 19, wherein the one or more diodes comprises a plurality of diodes configured as a rectifier.

21. The power module of claim 1, further comprising one or more busbars connected to the higher-current conductor structure and configured to provide input current.

22. The power module of claim 1, further comprising one or more busbars connected to the higher-current conductor structure and configured to provide output current.

23. The power module of claim 1, wherein the differential current sensor comprises a plurality of Hall effect elements.

24. The power module of claim 1, wherein the differential current sensor comprises a plurality of magnetoresistance (xMR) elements.

25. The power module of claim 24, wherein the plurality of xMR elements comprise tunneling magnetoresistance (TMR) elements.

26. The power module of claim 24, wherein the plurality of xMR elements comprise giant magnetoresistance (GMR) elements.

27. The power module of claim 24, wherein the plurality of xMR elements comprise anisotropic magnetoresistance (AMR) elements.

28. The power module of claim 1, wherein the higher-current conductor structure is connected to a second heat sink.

29. The power module of claim 1, wherein the first current is greater in magnitude than the second current.

30. The power module of claim 1, wherein the first current comprises an AC current.

31. The power module of claim 1, wherein the first current comprises a DC current.

32. The power module of claim 1, wherein the second current comprises a DC current.

\* \* \* \* \*